(12) United States Patent
Hannich et al.

(10) Patent No.: US 11,582,880 B2
(45) Date of Patent: Feb. 14, 2023

(54) ELECTRICAL DEVICE HAVING A HOUSING PART AND A COVER PART

(71) Applicant: SEW-EURODRIVE GMBH & CO. KG, Bruchsal (DE)

(72) Inventors: Thomas Hannich, Bruchsal (DE); Jürgen Hans Kollar, Bruchsal (DE); Klaus Kneller, Ubstadt-Weiher (DE)

(73) Assignee: SEW-EURODRIVE GMBH & CO. KG, Bruchsal (DE)

( * ) Notice: Subject to any disclaimer, the term of this patent is extended or adjusted under 35 U.S.C. 154(b) by 483 days.

(21) Appl. No.: 16/085,440

(22) PCT Filed: Feb. 14, 2017

(86) PCT No.: PCT/EP2017/025026
§ 371 (c)(1),
(2) Date: Sep. 14, 2018

(87) PCT Pub. No.: WO2017/157527
PCT Pub. Date: Sep. 21, 2017

(65) Prior Publication Data
US 2019/0082552 A1    Mar. 14, 2019

(30) Foreign Application Priority Data
Mar. 14, 2016  (DE) .................... 10 2016 002 993.5

(51) Int. Cl.
*H05K 7/14* (2006.01)
*H05K 1/11* (2006.01)
*H05K 7/20* (2006.01)

(52) U.S. Cl.
CPC ........... *H05K 7/1432* (2013.01); *H05K 1/117* (2013.01); *H05K 7/209* (2013.01); *H05K 7/2049* (2013.01)

(58) Field of Classification Search
CPC . H05K 7/11; H05K 7/117; H05K 7/20; H05K 7/1732; H05K 3/52; G06F 3/047; G06F 3/0354
(Continued)

(56) References Cited

U.S. PATENT DOCUMENTS 5,065,279 A * 11/1991 Lazenby ............. H01L 23/3672
361/720
5,124,888 A *  6/1992 Suzuki .................... H05B 41/02
361/740
(Continued)

FOREIGN PATENT DOCUMENTS

CN      102159051 A     8/2011
CN      104703428 A     6/2015
(Continued)

OTHER PUBLICATIONS

International Search Report dated Apr. 28, 2017, in International Application No. PCT/EP2017/025026 (English-language translation).
(Continued)

*Primary Examiner* — Tuan T Dinh
(74) *Attorney, Agent, or Firm* — Carter, DeLuca & Farrell LLP

(57) ABSTRACT

An electrical device includes a housing part and a cover part, the cover part being connected to the housing part, in particular with the aid of screws, the cover part in particular covering an opening of the housing part. A first circuit board is connected to the cover part, and an elastically preloaded sheet-metal part, in particular an elastically preloaded tab section of a sheet-metal part, presses at least one heat-generating component, in particular a controllable semiconductor switch, in the direction of the cover part, in particular (Continued)

for the purpose of dissipating heat from the heat-generating component into the environment via the cover part.

26 Claims, 5 Drawing Sheets

(58) Field of Classification Search
USPC .............. 361/700–710, 752–759, 807–818
See application file for complete search history.

(56) References Cited

U.S. PATENT DOCUMENTS

| | | | | |
|---|---|---|---|---|
| 5,562,410 | A * | 10/1996 | Sachs | F04D 29/601 |
| | | | | 361/695 |
| 5,633,572 | A * | 5/1997 | Steele | H02J 7/0045 |
| | | | | 320/107 |
| 5,774,353 | A | 6/1998 | Wieloch | |
| 5,801,330 | A | 9/1998 | Gademann et al. | |
| 5,831,822 | A * | 11/1998 | Hulick | G06F 1/183 |
| | | | | 361/679.48 |
| 6,025,991 | A * | 2/2000 | Saito | H05K 7/20436 |
| | | | | 361/704 |
| 8,139,347 | B2 * | 3/2012 | Chiang | G06F 1/169 |
| | | | | 361/679.18 |
| 8,456,437 | B2 * | 6/2013 | Chiang | G06F 3/03547 |
| | | | | 178/18.03 |
| 8,693,179 | B2 * | 4/2014 | Wei | G06F 3/03547 |
| | | | | 345/157 |
| 8,780,547 | B2 * | 7/2014 | Nakanishi | G03B 29/00 |
| | | | | 361/679.41 |
| 8,811,024 | B2 * | 8/2014 | Wei | G06F 1/169 |
| | | | | 361/679.18 |
| 9,110,638 | B2 * | 8/2015 | Yang | G06F 1/169 |
| 9,536,683 | B2 * | 1/2017 | Ho | G06F 3/03547 |
| 2002/0154487 | A1 * | 10/2002 | Weischhoff Van Rijn | |
| | | | | H05K 7/2049 |
| | | | | 361/719 |
| 2003/0147204 | A1 * | 8/2003 | Koike | H05K 5/0043 |
| | | | | 361/600 |
| 2005/0088826 | A1 * | 4/2005 | Throum | H05K 5/0052 |
| | | | | 361/719 |
| 2008/0124955 | A1 * | 5/2008 | Szu | H05K 7/1007 |
| | | | | 439/157 |
| 2011/0026231 | A1 * | 2/2011 | Scordino | H05K 7/1417 |
| | | | | 361/752 |
| 2012/0050971 | A1 * | 3/2012 | Seal | H05K 5/0004 |
| | | | | 361/679.02 |
| 2012/0267387 | A1 * | 10/2012 | Omdoll | A47K 10/32 |
| | | | | 221/1 |
| 2013/0347051 | A1 * | 12/2013 | Bose | H04N 21/418 |
| | | | | 725/151 |
| 2014/0092530 | A1 * | 4/2014 | Singh | H05K 7/1432 |
| | | | | 361/679.01 |
| 2014/0262481 | A1 * | 9/2014 | Khoury | H05K 7/1422 |
| | | | | 174/480 |
| 2014/0312158 | A1 * | 10/2014 | Hlushchenko | A47K 10/34 |
| | | | | 242/563.2 |
| 2015/0072196 | A1 * | 3/2015 | Soleski | H01M 2/1077 |
| | | | | 429/90 |
| 2015/0077958 | A1 * | 3/2015 | Takayuki | G06F 1/1658 |
| | | | | 361/759 |

FOREIGN PATENT DOCUMENTS

| | | |
|---|---|---|
| DE | 19604124 A1 | 8/1996 |
| EP | 1893010 A1 | 2/2008 |
| EP | 1921903 A2 | 5/2008 |
| EP | 2043418 A2 | 4/2009 |

OTHER PUBLICATIONS

International Preliminary Report on Patentability issued in International Patent Application No. PCT/EP2017/025026, dated Sep. 18, 2018 (9 pages total).

* cited by examiner

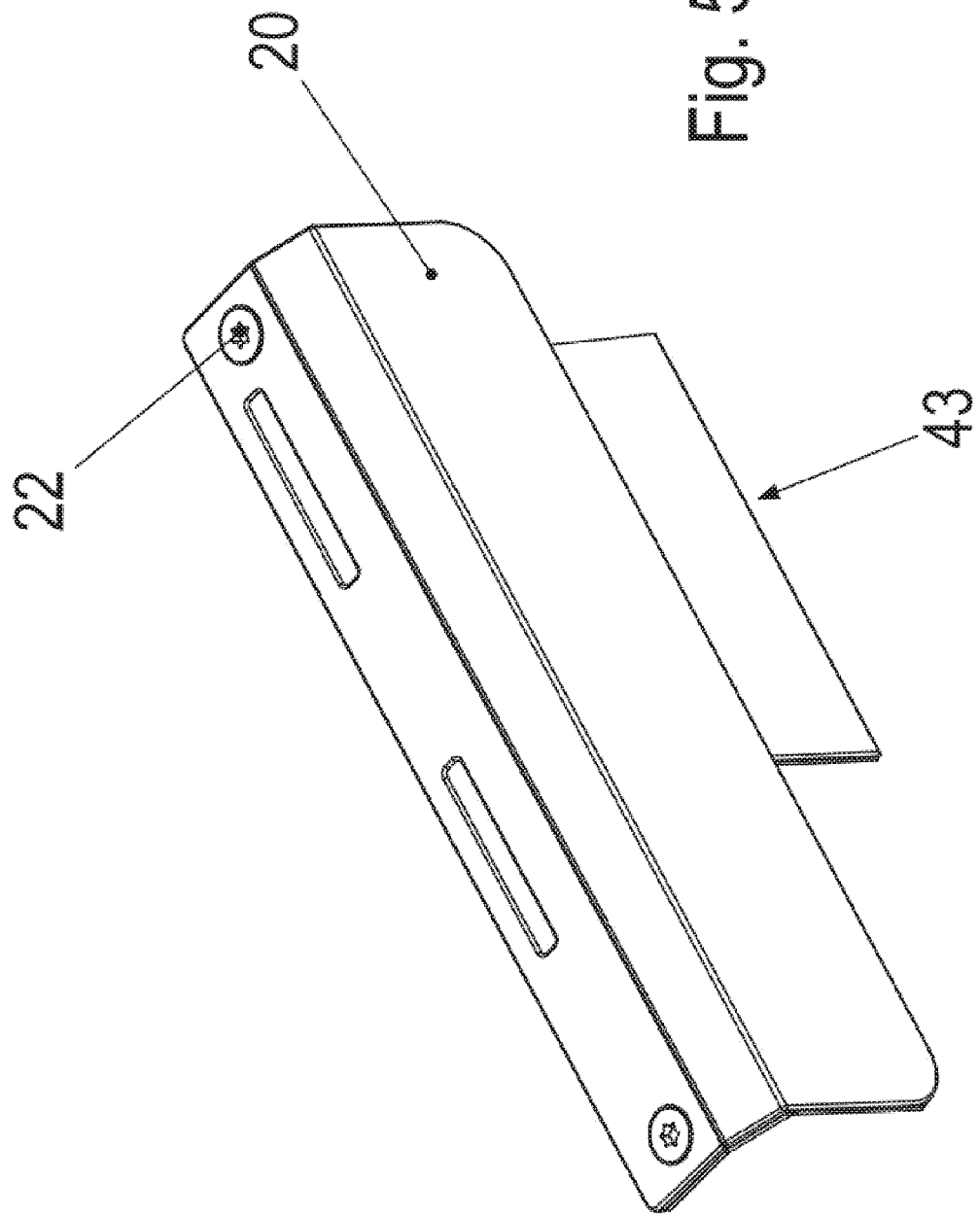

ELECTRICAL DEVICE HAVING A HOUSING PART AND A COVER PART

FIELD OF THE INVENTION

The present invention relates to an electrical device having a housing part and a cover part.

BACKGROUND INFORMATION

When mounting components on a circuit board, the connection bases or connection surfaces are connected to circuit traces of the circuit board with the aid of solder. On the one hand, the mounting therefore describes a mechanical positioning on the circuit board and a mechanical connection to the circuit board, and on the other hand, it describes an electrical connection.

It is generally conventional for a cover part to be used for covering an opening of a housing part.

SUMMARY

Example embodiments of the present invention provide an electrical device having a housing part and a cover part.

According to an example embodiment of the present invention, an electrical device has a housing part and a cover part. The cover part is connected to the housing part, in particular with the aid of screws, and the cover part particularly covers an opening of the housing part. A first circuit board is connected to the cover part, and an elastically preloaded sheet-metal part, in particular an elastically preloaded tab section of a sheet-metal part, presses at least one heat-generating component, in particular a controllable semiconductor switch, in the direction of the cover part, in particular for the purpose of dissipating heat from the heat-generating component into the environment via the cover part.

This arrangement offers the advantage that a simple cover part may be exchanged for a cover part on which an electronic circuit including the heat-generating component may be positioned. As a result, a switched-mode power supply, for example, may be provided, i.e. integrated into the cover part, as an electronic circuit. Different supply voltages are thereby able to be made available to the electrical device, which may be used to supply corresponding component assemblies. The lost heat of the component may be dissipated into the environment via the cover part. The cover part fans out the heat due to its metallic construction, in particular in the form of a metal die-cast component, and its therefore excellent thermal conduction.

According to an example embodiment of the present invention, an electrical device includes a housing part and a cover part, the cover part being connected to the housing part, in particular in a heat-conducting manner, in particular with the aid of screws, the cover part in particular covering an opening, in particular a recess of the housing part, wherein a first circuit board is connected to the cover part, an elastically preloaded sheet-metal part, in particular an elastically preloaded tab section of a sheet-metal part, presses at least one heat-generating component, in particular a controllable semiconductor switch, in the direction of the cover part, the pressing part in particular being braced on the cover part, in particular for the purpose of dissipating heat from the heat-generating component into the environment via the cover part.

The cover part may be produced as a metal die-cast component. This offers the advantage of allowing for a cost-effective and uncomplicated production.

The heat-generating components may be mounted on a first circuit board. The first circuit board, in particular circuit traces of the first circuit board, may be electrically connectable to a second circuit board, in particular to circuit traces of a second circuit board, by being at least partially inserted into a plug-connector part, the plug-connector part being disposed, in particular mounted, on the second circuit board. The second circuit board may be connected to the housing part, in particular with the aid of screws. This offers the advantage that the voltages generated on the first circuit board are able to be made available to the component assemblies situated on the second circuit board or electrically connected to the second circuit board. When placing the cover part on top of the housing part, the opening of the housing part may be closed and the electrical plug connection may be actuated at the same time. For guidance and centering purposes during the insertion, a plug section is molded on the cover part and corresponding shoulders are provided on the housing part as contact limitations when the cover part is slipped on.

A screw part, in particular a screw head of the screw part, may hold the sheet metal part in a preloaded manner with respect to the cover part. This offers the advantage of ensuring an elastic contact pressure and thus an efficient heat dissipation.

A screw part, in particular a shoulder of the screw part, may press the first circuit board against the cover part. This offers the advantage that the screw part executes multiple functions, i.e. it exerts pressure on the first circuit board on the one hand, and elastically preloads the sheet-metal part on the other, which in turn presses the component against the cover part. This provides a simple joining technique, which simultaneously ensures an excellent dissipation of heat.

The heat-generating component may be disposed in a continuous recess of the circuit board, in particular such that the bearing section of the cover part acting as a support surface for the first circuit board is at a smaller distance from the circuit board than the bearing section of the cover part acting as a support surface for the heat-generating component, in particular, the bearing section of the cover part acting as a support surface for the first circuit board touching the circuit board, i.e. having a vanishing distance from the circuit board. This offers the advantage that the component is able to be connected via its connection bases to circuit traces of the circuit board with the aid of a solder connection. As a result, the component is able to be disposed in a suspended manner in the recess and then is pressed against the contact surface, i.e., the recessed bearing section of the cover part, by the tab section of the sheet-metal part, which presses against the side of the component facing away from the cover part.

The housing part may include a slot, in particular a continuous slot, a tab section of the sheet-metal part at least partially projecting into the slot or projecting through it. This has the advantage that one or two screw part(s) is/are sufficient to provide stable hold for the sheet-metal part inasmuch as the slot serves as a third or fourth contact point and thereby keeps the sheet-metal part in place. In addition, the slot also acts as a limiting aid so that the sheet-metal part is unable to further shift toward the side. Moreover, because of the preloading with the aid of the screw part(s), the sheet-metal part is also pressed against the housing part in the slot and securely retained there in addition.

The cover part may have a plug-in section, which adjoins a shoulder, the shoulder resting against a section of the edge of the opening of the housing part, the plug-in section resting against a subregion of the wall of the housing part. This offers the advantage that the plug-in section provides for easy guidance and centering during the insertion into the housing part.

The housing part may have cooling fins for dissipating waste heat from components, in particular from controllable semiconductor switches, which are mounted on the second circuit board or are electrically connected to the second circuit board, a fan being introduced into a housing pocket of the housing part, and the airflow conveyed by the fan passing along the cooling fins of the housing part. This has the advantage of allowing for effective cooling of the electrical device. In addition, it is even possible to dissipate a heat flow from the cover part via the housing part into the environment, in particular in the presence of a strong airflow conveyed by the fan.

The electrical device may be arranged as a power inverter, a converter, or a part thereof. This has the advantage of allowing for the optional use of the cover part including the circuit board and the switched-mode power supply provided thereon, rather than a simple cover part.

Further features and aspects of example embodiments of the present invention are described in greater detail with reference to the appended Figures.

BRIEF DESCRIPTION OF THE DRAWINGS

FIG. 5 shows cover part 20 from a different viewing direction.

DETAILED DESCRIPTION

As illustrated in the Figures, the electrical device according to an example embodiment of the present invention has a housing part 1 that includes an opening.

The opening is able to be sealed by connecting cover part 20 to housing part 1 with the aid of screws.

For example, the electrical device is a power inverter, a converter, or a part thereof.

Figure 1:
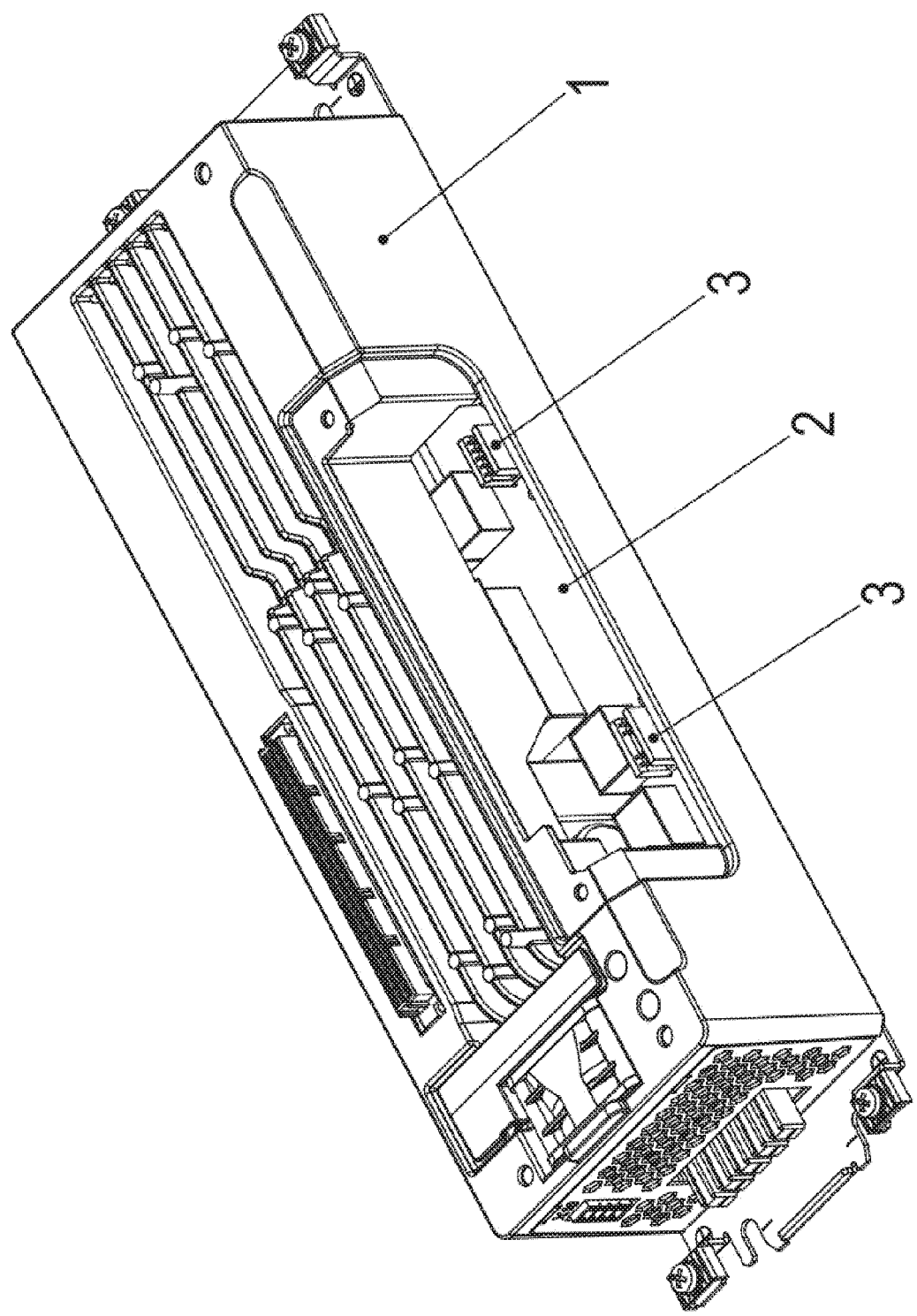
FIG. 1 shows housing part 1 in an oblique view, housing part 1 having an opening, which is able to be covered by a cover part 20.
Figure 2:
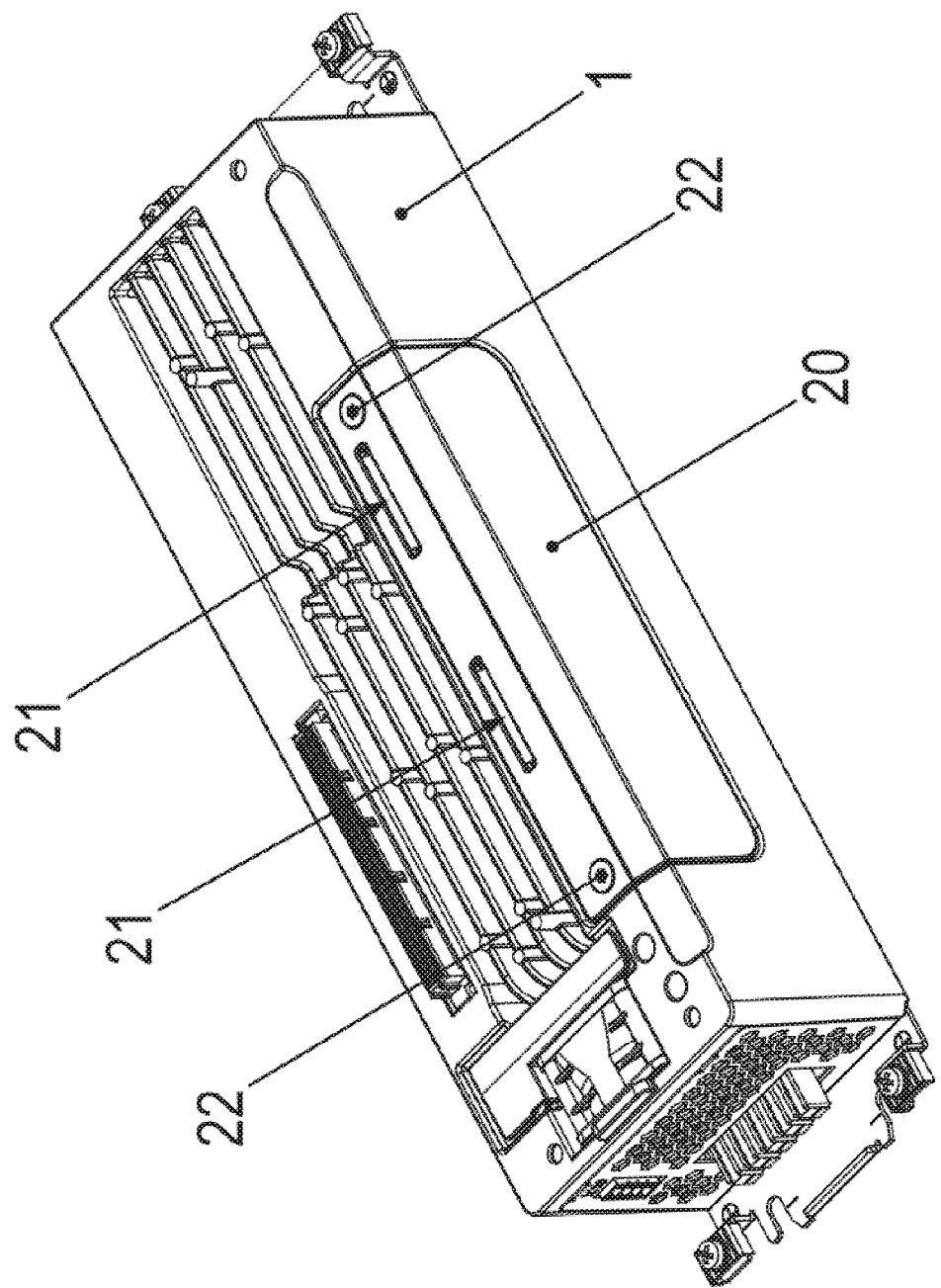
FIG. 2 shows housing part 1 together with cover part 20, which is placed on top of housing part 1 and covers the opening.

As illustrated in FIG. 1, a second circuit board 2 is situated in housing part 1; mounted on second circuit board 2 are electronic components and also at least one plug-connector part 3.

As components, for example, the controllable semiconductor switches of a converter are electrically connected to circuit traces of second circuit board 2. Housing part 1 may be arranged as a die-cast part and also has cooling fins, to which the heat generated by the controllable semiconductor switches mounted on second circuit board 2 is dissipated.

The opening is situated to the side of the cooling fins on housing part 1.

Threaded bores are introduced into housing part 1, into which connection screws 22 are able to be screwed, their screw heads pressing cover part 20 toward housing part 1 in each case.

Cover part 20 has two continuous slots 21, and a respective tab section of a sheet-metal part 30 is inserted into respective slot 21.

Figure 3:
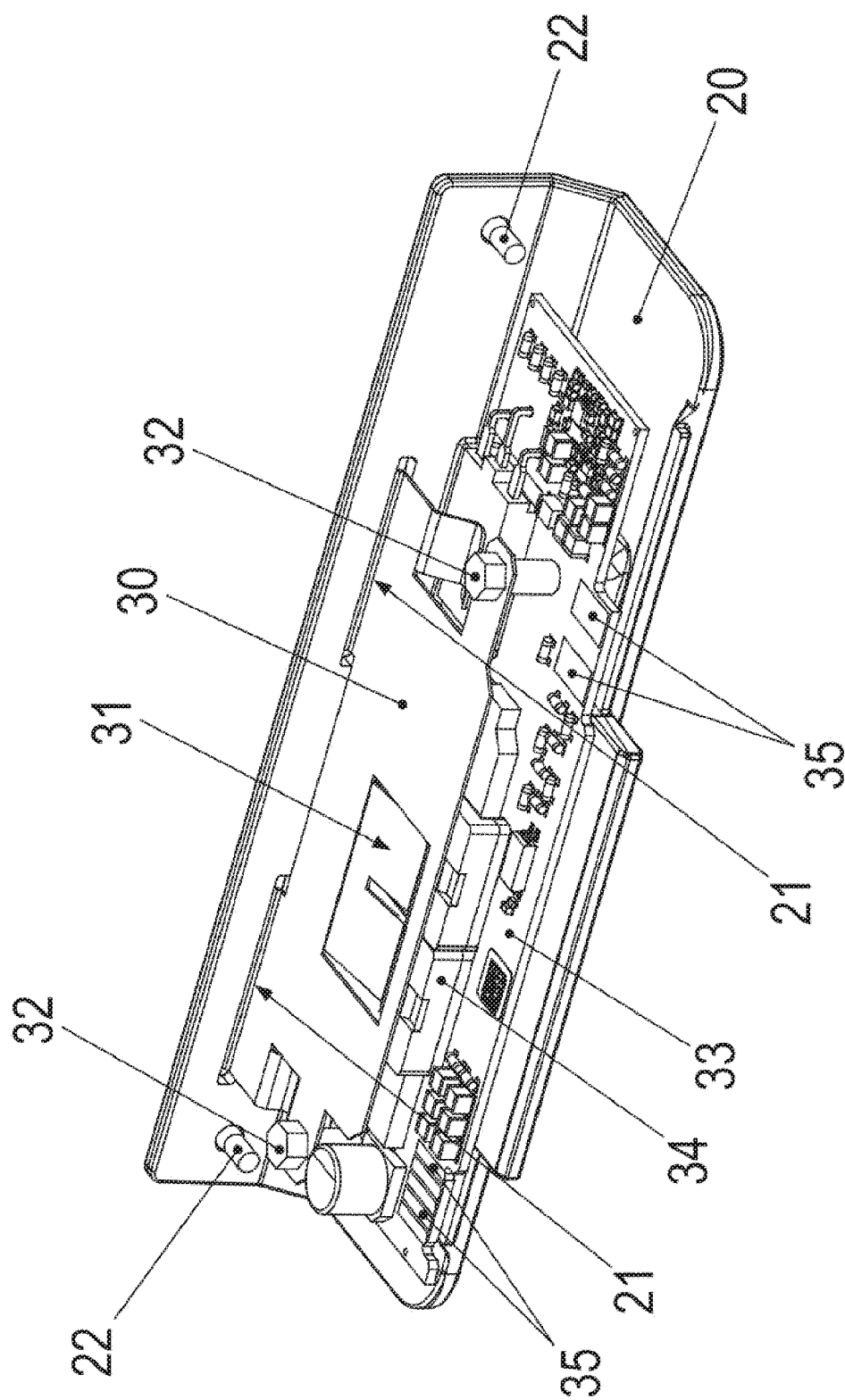
FIG. 3 shows cover part 20 from a different viewing direction, a first circuit board 33 being situated on the inner side of cover part 20.

As illustrated in FIG. 3, via their respective threaded section, screws 32 are screwed into threaded bores which are disposed in a first bearing section 41 in each case. Sheet-metal part 30 is delimited by the screw heads of screws 32 and pressed in the direction of cover part 20.

The respective threaded section of screws 32 is not visible in FIG. 3.

Screws 32 have a shoulder against which circuit board 33 is resting and thus is pressed in the direction of cover part 20 by respective screw 32.

Sheet-metal part 30 has a tab section 31, which is elastically preloaded and presses against a heat-generating component 34, thereby pressing component 34 toward bearing section 40, which is disposed on the inner side of cover part 20.

Components 34 are connected via their connection bases to circuit traces of circuit board 33 with the aid of a solder connection.

Using circuit traces 35, circuit board 33 is plugged by its circuit traces 35 into a corresponding plug-connector part 3 disposed on second circuit board 2 when cover part 20 is placed on housing 1 and connected thereto with the aid of screws. In this manner, an electrical contacting is achieved between the first and second circuit board (2, 33).

A switched-mode power supply, i.e. an electronic circuit for generating different supply voltages for the electronic component assemblies of the electrical device, is situated on circuit board 33.

When circuit traces 35 are inserted into plug-connector part 3, which is mounted on second circuit board 2, spring contacts of plug-connector part 3 contact circuit traces 35 of first circuit board 33. This makes it possible to supply the generated voltages to the remaining electrical component assemblies of the electrical device, in particular to the component assemblies situated on circuit board 2.

Bearing section 40 for component 34 is recessed in comparison with first bearing section 41 and second bearing section 42 for circuit board 33. As a result, sheet-metal part 30 may have a corresponding planar arrangement, and tab section 31 may be produced as a punched-out section.

Cover part 20 is arranged as a die-cast component and covers the opening, i.e. the open duct, of housing part 1.

Figure 4:
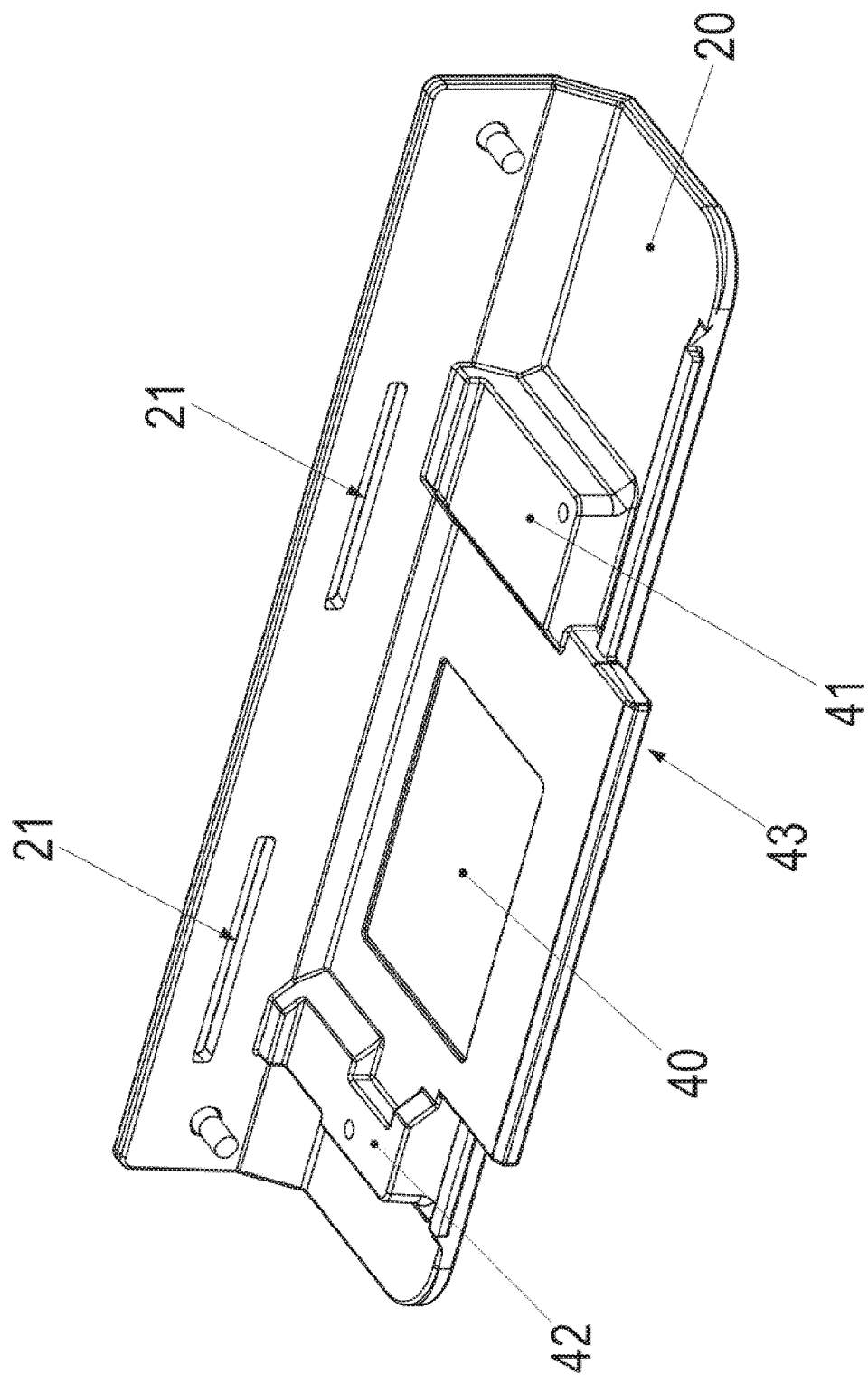
FIG. 4 shows bare cover part 20.

As illustrated in FIGS. 4 and 5, cover part 20 includes a plug-in section 43, which has a shoulder in the direction of contact surface 40; when cover part 20 is placed on top, a region of the edge of the opening, i.e. a region of the wall of housing part 1, is therefore resting against the shoulder, and plug-in section 43 is resting against the inner side of the wall of housing part 1.

Plug-in section 43 thus is used for the more precise positioning of cover part 20 with respect to housing part 1.

Cover part 20 also functions as a cooling element spreading the heat since the heat, i.e. the lost heat, produced by the heat-generating components, i.e. by the controllable semiconductor switches, is conveyed to cover part 20, where it is fanned out because of the metallic construction of cover part 20 and its related excellent thermal conduction. A large portion of the heat is dissipated into the environment via the outer side of cover element 20. However, a heat flow is also conducted to housing part 1.

Screw part 32 thus has a screw head in each case that is broader, and thus particularly has a larger diameter, than an axially adjoining cylindrical section of screw part 32. The threaded section of screw part 32 is disposed in the region that is axially facing away from this cylindrical section. Thus, a substantially monotonically decreasing diameter is provided in the axial direction, i.e. from the screw head to the threaded section of screw part 32.

Housing part 1 is arranged as one piece. In further exemplary embodiments, housing part 1 may also be provided in multiple pieces but this would then require additional connection parts.

LIST OF REFERENCE NUMERALS

1 Housing part
2 Second circuit board
3 Plug-connector part
20 Cover part
21 Slots, in particular continuous slots
22 Connection screws
30 Sheet-metal part
31 Tab section of sheet-metal part 30
32 Screw part
33 Circuit board
34 Heat-generating component, in particular controllable semiconductor switch
35 Circuit traces of circuit board 33
40 Bearing section for component 34
41 First bearing section for circuit board 33
42 Second bearing section for circuit board 33
43 Plug-in section

The invention claimed is:

1. An electrical device, comprising:
a housing part;
a cover part connected to the housing part by a screw connection, the cover part covering an opening of the housing part;
a first circuit board connected to the cover part; and
an elastically preloaded sheet-metal part and/or an elastically preloaded tab section of a sheet-metal part pressing at least one heat-generating component and/or controllable semiconductor switch in the direction of the cover part, a pressing part being braced on the cover part;
wherein the cover part is adapted to dissipate heat from the heat-generating component and/or controllable semi-conductor switch into a surrounding environment.

2. The electrical device according to claim 1, wherein the cover part is formed of metal and/or as a metal die-cast component.

3. The electrical device according to claim 1, wherein the heat-generating component is electrically connected to circuit traces of the first circuit board and/or is mounted on the first circuit board, the first circuit board and/or circuit traces of the first circuit board being connected and/or electrically connectable to a second circuit board by being at least partially inserted into a plug-connector part, the plug-connector part being situated and/or mounted on the second circuit board, the second circuit board being connected and/or screw-connected to the housing part.

4. The electrical device according to claim 1, wherein the sheet-metal part is held by a screw part and/or a screw head of the screw part with elastic preloading with respect to the cover part.

5. The electrical device according to claim 1, wherein the heat-generating component is situated in a continuous recess of the first circuit board, a bearing section of the cover part functioning as a support surface for the first circuit board having a smaller distance from the first circuit board than the bearing section of the cover part acting as a support surface for the heat-generating component, the bearing section of the cover part acting as a support surface for the first circuit board, touching the circuit board, and/or having a vanishing distance from the first circuit board.

6. The electrical device according to claim 1, wherein the housing part has a slot, and a tab section of the sheet-metal part at least partially projects into the slot and/or through the slot.

7. The electrical device according to claim 1, wherein the cover part includes a plug-in section that adjoins a shoulder, the shoulder resting against a section of an edge of the opening of the housing part, the plug-in section resting against a subregion of a wall of the housing part.

8. The electrical device according to claim 1, wherein the electrical device is arranged as a power inverter, a converter, a part of a power inverter, and/or a part of a converter.

9. The electrical device according to claim 3, wherein the first circuit board is pressed against the cover part by a screw part and/or a shoulder of the screw part.

10. The electrical device according to claim 3, wherein the housing part includes cooling fins adapted to dissipating lost heat from components and/or controllable semiconductor switches mounted on and/or electrically connected to the second circuit board, the electrical device further comprising a fan being arranged in a housing pocket of the housing part, the fan adapted to convey an airflow that flows along the cooling fins of the housing part.

11. The electrical device according to claim 6, wherein the slot is arranged as a continuous slot.

12. An electrical device, comprising:
a housing part;
a cover part connected to the housing part, the cover part covering an opening of the housing part;
a first circuit board connected to the cover part; and
an elastically preloaded sheet-metal part pressing at least one heat-generating component in the direction of the cover part;
wherein the cover part is adapted to dissipate heat from the heat-generating component into a surrounding environment.

13. The electrical device according to claim 12, wherein the cover part is connected to the housing part by a screw connection.

14. The electrical device according to claim 12, wherein the elastically preloaded sheet-metal part includes an elastically preloaded tab section of the sheet-metal part.

15. The electrical device according to claim 12, wherein the heat-generating component includes a controllable semiconductor switch.

16. The electrical device according to claim 12, wherein a pressing part of the elastically preloaded sheet-metal part that presses the at least one heat-generating component in the direction of the cover part is braced on the cover part.

17. The electrical device according to claim 12, wherein the cover part is formed of metal and/or as a metal die-cast component.

18. The electrical device according to claim 12, wherein the heat-generating component is electrically connected to circuit traces of the first circuit board and/or is mounted on the first circuit board, the first circuit board and/or circuit traces of the first circuit board being connected and/or electrically connectable to a second circuit board by being at least partially inserted into a plug-connector part, the plug-connector part being situated and/or mounted on the second circuit board, the second circuit board being connected and/or screw-connected to the housing part.

19. The electrical device according to claim 12, wherein the sheet-metal part is held by a screw part and/or a screw head of the screw part with elastic preloading with respect to the cover part.

20. The electrical device according to claim 12, wherein the heat-generating component is situated in a continuous recess of the first circuit board, a bearing section of the cover part functioning as a support surface for the first circuit board having a smaller distance from the first circuit board than the bearing section of the cover part acting as a support surface for the heat-generating component, the bearing section of the cover part acting as a support surface for the first circuit board, touching the circuit board, and/or having a vanishing distance from the first circuit board.

21. The electrical device according to claim 12, wherein the housing part has a slot, and a tab section of the sheet-metal part at least partially projects into the slot and/or through the slot.

22. The electrical device according to claim 12, wherein the cover part includes a plug-in section that adjoins a shoulder, the shoulder resting against a section of an edge of the opening of the housing part, the plug-in section resting against a subregion of a wall of the housing part.

23. The electrical device according to claim 12, wherein the electrical device is arranged as a power inverter, a converter, a part of a power inverter, and/or a part of a converter.

24. The electrical device according to claim 18, wherein the first circuit board is pressed against the cover part by a screw part and/or a shoulder of the screw part.

25. The electrical device according to claim 18, wherein the housing part includes cooling fins adapted to dissipating lost heat from components and/or controllable semiconductor switches mounted on and/or electrically connected to the second circuit board, the electrical device further comprising a fan being arranged in a housing pocket of the housing part, the fan adapted to convey an airflow that flows along the cooling fins of the housing part.

26. The electrical device according to claim 21, wherein the slot is arranged as a continuous slot.

* * * * *